(12) United States Patent
Hshieh et al.

(10) Patent No.: US 6,420,768 B1
(45) Date of Patent: Jul. 16, 2002

(54) TRENCH SCHOTTKY BARRIER RECTIFIER AND METHOD OF MAKING THE SAME

(75) Inventors: Fwu-Iuan Hshieh, Saratoga; Koon Chong So, Fremont; John E. Amato, Tracy, all of CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/737,357

(22) Filed: Dec. 15, 2000

(51) Int. Cl.⁷ .............................................. H01L 27/095
(52) U.S. Cl. ........................ 257/483; 257/520; 257/622
(58) Field of Search ................................. 257/483, 476, 257/520, 594, 622, 623

(56) References Cited

U.S. PATENT DOCUMENTS

| | | | |
|---|---|---|---|
| 4,982,260 A | 1/1991 | Change et al. | 257/656 |
| 5,262,668 A | 11/1993 | Tu et al. | 257/475 |
| 5,365,102 A | 11/1994 | Mehrotra et al. | 257/475 |
| 5,612,567 A | 3/1997 | Baliga | 257/475 |

*Primary Examiner*—Mark V. Prenty
(74) *Attorney, Agent, or Firm*—Mayer Fortkort & Williams, PC; David B. Bonham (57) ABSTRACT

A trench Schottky barrier rectifier and a method of making the same in which the rectifier has a semiconductor region having first and second opposing faces; the semiconductor region having a drift region of first conductivity type adjacent the first face and a cathode region of the first conductivity type adjacent the second face; the drift region having a lower net doping concentration than that of the cathode region. The rectifier also has a plurality of trenches extending into the semiconductor region from the first face; the trenches defining a plurality of mesas within the semiconductor region, and the trenches forming a plurality of trench intersections. The rectifier further includes an oxide layer covering the semiconductor region on bottoms of the trenches and on lower portions of sidewalls of the trenches, a polysilicon region disposed over the oxide layer within the trenches, and insulating regions at the trench intersections that cover a portion of the polysilicon region and a portion of the oxide layer.

9 Claims, 12 Drawing Sheets

TRENCH SCHOTTKY BARRIER RECTIFIER AND METHOD OF MAKING THE SAME

This application is related to U.S. Ser. No. 09/653,084 filed Aug. 31, 2000 and entitled "Trench Schottky Rectifier," the entire disclosure of which is hereby incorporated by reference.

FIELD OF THE INVENTION

This invention relates to rectifying devices and more particularly to trench Schottky barrier rectifiers as well as methods of forming these devices.

BACKGROUND AND SUMMARY OF THE INVENTION

Rectifiers exhibit relatively low resistance to current flow in a forward direction and a high resistance to current flow in a reverse direction. Trench Schottky barrier rectifiers are a type of rectifier that have found use as output rectifiers in switching-mode power supplies and in other high-speed power switching applications such as motor drives. These devices are capable of carrying large forward currents and supporting large reverse blocking voltages.

Figure 1:
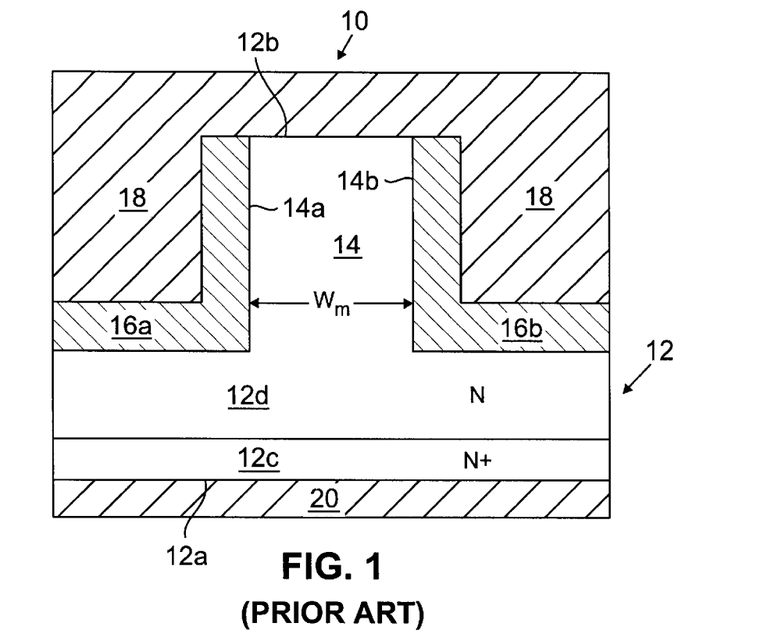
FIG. 1 is a partial cross-sectional view of a trench Schottky barrier rectifier in accordance with the prior art.

U.S. Pat. No. 5,365,102 to Mehrotra et al. and entitled "Schottky Barrier Rectifier with MOS Trench", the entire disclosure of which is hereby incorporated by reference, discloses trench Schottky barrier rectifiers which have a higher breakdown voltage than is theoretically attainable with an ideal abrupt parallel-plane P-N junction. A cross-sectional representation of one embodiment of the described rectifiers is illustrated in FIG. 1. In this figure, rectifier 10 includes a semiconductor substrate 12 of first conductivity type, typically N-type conductivity, having a first face 12a and a second opposing face 12b. The substrate 12 comprises a relatively highly doped cathode region 12c (shown as N+) adjacent the first face 12a. A drift region 12d of first conductivity type (shown as N) extends from the cathode region 12c to the second face 12b. Accordingly, the doping concentration of the cathode region 12c is greater than that of the drift region 12d. A mesa 14 having a cross-sectional width "Wm", defined by opposing sides 14a and 14b, is formed in the drift region 12d. The mesa can be of stripe, rectangular, cylindrical or other similar geometry. Insulating regions 16a and 16b (described as SiO$_2$) are also provided on the mesa sides. The rectifier also includes an anode electrode 18 on the insulating regions 16a, 16b. The anode electrode 18 forms a Schottky rectifying contact with the mesa 14 at second face 12b. The height of the Schottky barrier formed at the anode electrode/mesa interface is dependent on the type of electrode metal and semiconductor (e.g., Si, Ge, GaAs, and SiC) used and is also dependent on the doping concentration in the mesa 14. Finally, a cathode electrode 20 is provided adjacent the cathode region 12c at the first face 12a. The cathode electrode 20 ohmically contacts cathode region 12c.

In a process described in U.S. Pat. No. 5,365,102, drift region 12d is provided by epitaxial growth on substrate 12c. Trenches are then etched through photoresist-patterned nitride layers, forming discrete mesas 14 having thermal oxidation resistant nitride caps. Insulating regions 16, preferably silicon dioxide, are formed on the trench sidewalls and bottoms 22b, but not on the tops of the mesas 14 (faces 12b) because of the presence of the nitride regions. The nitride regions (as well as any stress relief oxide regions, if present) are removed, and anode 18 and cathode 20 metallization provided. For more information, see U.S. Pat. No. 5,365,102.

As is discussed more fully below, the present invention concerns improvements in trench Schottky barrier rectifiers related to those in U.S. Pat. No. 5,365,102 and to processes for making such trench Schottky barrier rectifiers.

SUMMARY OF THE INVENTION

According to an embodiment of the invention, a method of forming a trench Schottky barrier rectifier is provided. The method comprises:

(a) Forming a semiconductor region having first and second opposing faces. The semiconductor region comprises a drift region of first conductivity type adjacent the first face and a cathode region of the first conductivity type adjacent the second face. The drift region has a lower net doping concentration than the net doping concentration associated with the cathode region.

(b) Forming a plurality of trenches that extend into the semiconductor region from the first face. These trenches define a plurality of mesas within the semiconductor region and form trench intersections at a plurality of locations.

(c) Providing an oxide layer that covers the semiconductor region at locations that correspond to trench bottoms and lower portions of the trench sidewalls.

(d) Providing a polysilicon region that is disposed within the trenches over the oxide layer.

(e) Providing insulating regions over the oxide layer at the trench intersections.

(f) Providing an anode electrode that is adjacent to and forms a Schottky rectifying contact with the drift region.

Where desired, the rectifier can be provided with a cathode electrode on the second face of the semiconductor region.

The semiconductor is preferably a silicon semiconductor and has n-type conductivity. Preferred insulating regions are borophosphosilicate glass regions.

The step of forming the semiconductor region preferably includes providing a semiconductor substrate corresponding to the cathode region, and subsequently growing an epitaxial semiconductor layer corresponding to the drift region on the substrate.

The step of forming the trenches preferably comprises: forming a patterned masking layer over the first face of the semiconductor region and etching the trenches through the masking layer. In some embodiments, the trenches are etched into the drift regions, but not into the cathode region. In others, the trenches are etched sufficiently deeply such that they extend through the drift region and into the cathode region.

The steps of forming the oxide layer, the polysilicon region, and the insulating regions preferably further comprise the following: (a) forming an oxide layer on the first face of the semiconductor region and within the trenches, for example, by thermal growth or by oxide deposition processes; (b) forming a polysilicon layer over the oxide layer; (c) etching the polysilicon layer such that that portions of the oxide layer are exposed over the first face, and portions of the oxide layer are exposed over upper portions of the trench sidewalls; (d) forming an insulating layer over the oxide layer and the etched polysilicon layer; (e) forming a patterned etch resistant layer over the insulating layer at the trench intersections; and (f) etching the insulating layer and the oxide layer where not covered by the patterned etch resistant layer.

According to another embodiment of the invention, a trench Schottky barrier rectifier is provided. The rectifier comprises:

(a) A semiconductor region having first and second opposing faces. The semiconductor region comprises a drift region of first conductivity type adjacent the first face and a cathode region of the first conductivity type adjacent the second face. The drift region has a lower net doping concentration than that of the cathode region.

(b) A plurality of trenches extending into the semiconductor region from the first face. The trenches define a plurality of mesas within the semiconductor region, and the trenches form a plurality of trench intersections.

(c) An oxide layer covering the semiconductor region on bottoms of the trenches and on lower portions of sidewalls of the trenches.

(d) A polysilicon region disposed over the oxide layer within the trenches.

(e) Insulating regions at the trench intersections that cover a portion of the polysilicon region and a portion of the oxide layer.

(f) An anode electrode that is adjacent to and forms a Schottky rectifying contact with the drift region.

A number of trench intersection angles are possible. In one preferred case, the trenches intersect at right angles to one another. A number of configurations are possible for the insulating regions at the trench intersections. In one preferred instance, the insulating regions are rectangular when viewed from above the trenches.

One advantage of the present invention is that trench Schottky barrier rectifiers, in which cells are defined by intersecting trenches, can be formed in high yield, due to improved process control at trench intersection regions.

Another advantage of the present invention is that such trench Schottky barrier rectifiers can be formed without substantial risk of degradation in "pinch off" at the trench intersection regions. Degradation of this type serves to decrease reverse bias breakdown voltages and increase leakage currents.

These and other embodiments and advantages of the present invention will become readily apparent to those skilled in the art upon review of the disclosure to follow.

BRIEF DESCRIPTION OF THE DRAWINGS

As is commonly the case with such figures, the above figures are not to scale.

DETAILED DESCRIPTION OF CERTAIN PREFERRED EMBODIMENTS OF THE INVENTION

The present invention now will be described more fully hereinafter with reference to the accompanying drawings, in which preferred embodiments of the invention are shown. This invention may, however, be embodied in different forms and should not be construed as limited to the embodiments set forth herein.

Figure 2:
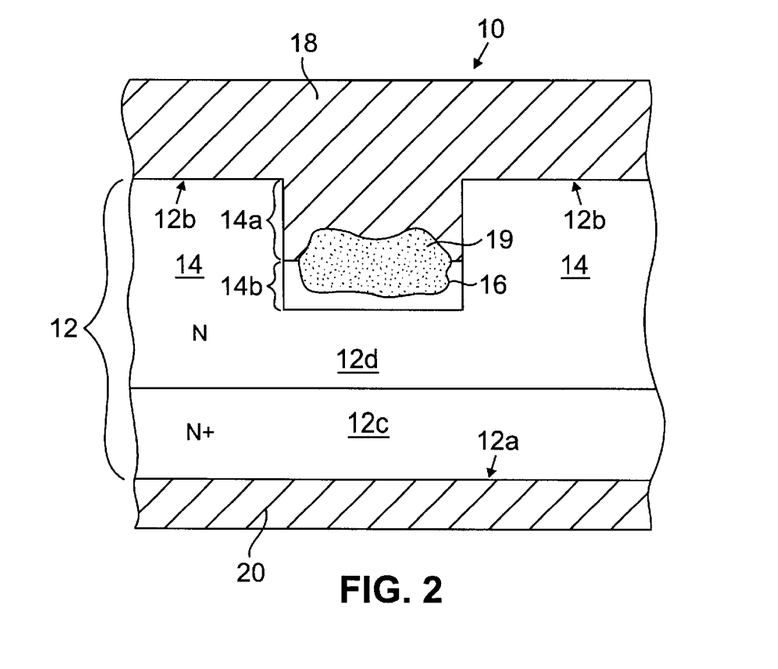
FIG. 2 is a partial cross-sectional view of a trench Schottky barrier rectifier that is related to the present invention.

Commonly assigned copending U.S. Ser. No. 09/653,084 describes a rectifier design that provides low forward-biased voltage drop, low reverse-biased leakage current and high breakdown voltage. FIG. 2 illustrates one embodiment of such a rectifier 10 in partial cross-section. Rectifier 10 includes a semiconductor region 12 of first conductivity type, typically N-type conductivity, having a first face 12a and second opposing faces 12b. The substrate semiconductor region 12 preferably comprises a relatively highly doped cathode region 12c (shown as N+) adjacent first face 12a. In the 30-volt silicon device illustrated, the cathode region 12c is doped to a dopant concentration of about $5 \times 10^{19}/cm^3$. A drift region 12d of first conductivity type (shown as N) preferably extends from the cathode region 12c to second faces 12b. The drift region 12d is doped to a dopant concentration of about $3.3 \times 10^{16}/cm^3$ for the device illustrated. Drift region 12d and cathode region 12c form a non-rectifying N+/N junction.

Mesas 14 (which are only partially illustrated) are defined in the drift region 12d by opposing trenches as is known in the art. Mesa width is typically on the order of 1 micron and trench depth is typically on the order of 3 microns for the device shown. Trenches are shown extending into the drift region 12d, but can also extend further into the cathode region 12c. Mesas 14 extend in a third dimension (not shown) and can be of stripe, rectangular, cylindrical or other similar geometry. Insulating regions 16 are formed within the trenches and are adjacent the semiconductor region 12 along lower portions 14b of the semiconductor/trench interfaces. In this case, the insulating regions 16 are shown as oxide layers, more specifically silicon oxide layers, which can be thermally grown or deposited. Insulating regions 16 typically have a thickness on the order of about 700 to 2000 Angstroms. Polysilicon conductive regions 19 are located over the insulating regions 16 in the trenches between mesas 14.

Anode electrode 18 is found immediately adjacent to the drain region 12d along faces 12b and along upper portions 14a of the semiconductor/trench interfaces. Anode electrode 18 is also located immediately adjacent upper portions of the insulating regions 16 and polysilicon regions 19. Anode electrode 18 forms a Schottky barrier rectifying junction where it contacts the semiconductor drain region 12d, i.e., along upper portions 14a and second faces 12b.

A cathode electrode 20 is provided adjacent the cathode region 12c at the first face 12a. The cathode electrode preferably forms an ohmic contact with the cathode region 12c.

The device shown in FIG. 2 provides improved voltage drop characteristics, reverse bias breakdown voltages and leakage currents. Without wishing to be bound by theory, it is believed that this design provides improved forward voltage drop characteristics relative to the design of FIG. 1, because the surface area of the Schottky rectifying contact between the anode electrode 18 and the drift region 12d is increased by extending the contact area beyond second face 12b and into the upper portions 14a. At the same time, the insulating region 16 adjacent lower portions 14b causes charge coupling to occur between the anode electrode 18 and mesa 14, with the resulting depletion creating a desirable "pinch off" effect. This favorably affects the voltage profiles within the mesa structure, providing high reverse bias breakdown voltages and low leakage currents.

One scheme for manufacturing a trench Schottky barrier rectifier like that of FIG. 2 is now described in connection with FIGS. 3A–G and 4A–G. A plan view illustrating the intersection of two trenches 21, which are located between mesas 14, is shown in FIG. 5. The position of the cross-section associated with FIGS. 3A–3G, is illustrated by dashed line A–A' in this figure, which is midway between the horizontal trench shown and the next horizontal trench (not shown). The position of the cross-section associated with FIGS. 4A–4G is illustrated by dashed line B–B' and is immediately adjacent the trench intersection.

Referring now to FIGS. 3A–G and 4A–G, an N-doped epitaxial layer (corresponding to drift region 12d) is grown on a conventionally N+ doped substrate (corresponding to cathode region 12c). Epitaxial layer 12d is typically about 7 microns thick. Next, a photoresist masking process is used to form mask portions (not shown), which define the location of trenches 21. Trenches 21 are preferably dry etched through openings between mask portions by reactive ion etching, typically to a depth of about 3 microns. Mask portions are removed, resulting in the structures of FIG. 3A (far from the trench intersection) and FIG. 4A (adjacent the trench intersection). These structures are essentially the same at this point in the process.

Figure 3A:
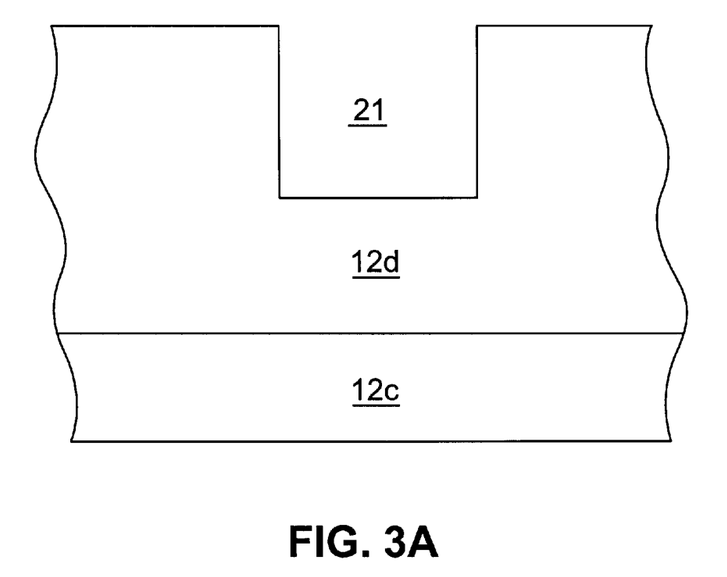
FIGS. 3A–3G are partial cross-sectional views taken along line A–A' of FIG. 5, which illustrate one method by which the trench Schottky barrier rectifier of FIG. 2 can be fabricated.
Figure 3B:
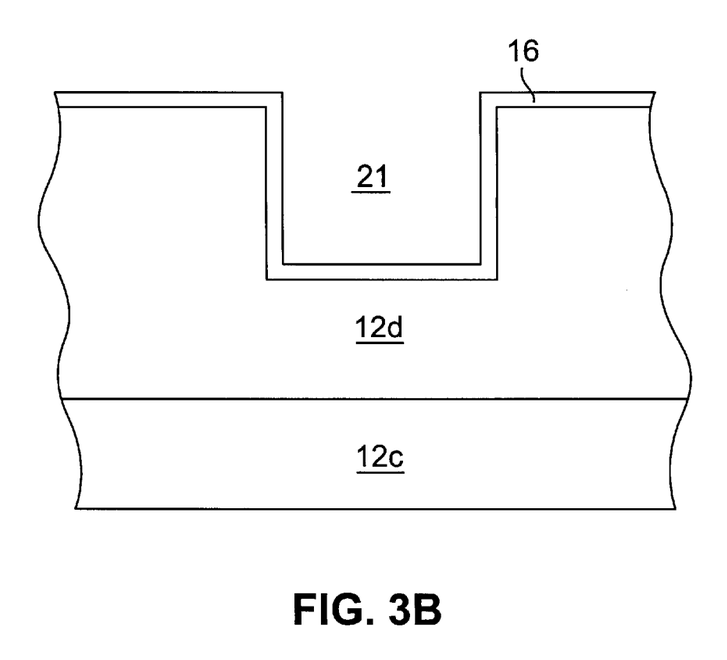
Figure 4A:
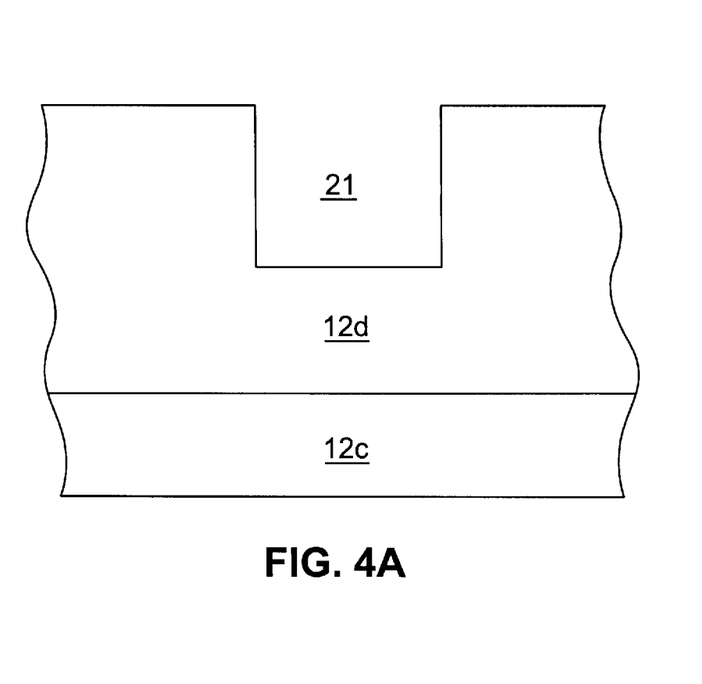
FIGS. 4A–4G are partial cross-sectional views taken along line B–B' of FIG. 5, which illustrate one method by which the trench Schottky barrier rectifier of FIG. 2 can be fabricated.
Figure 4B:
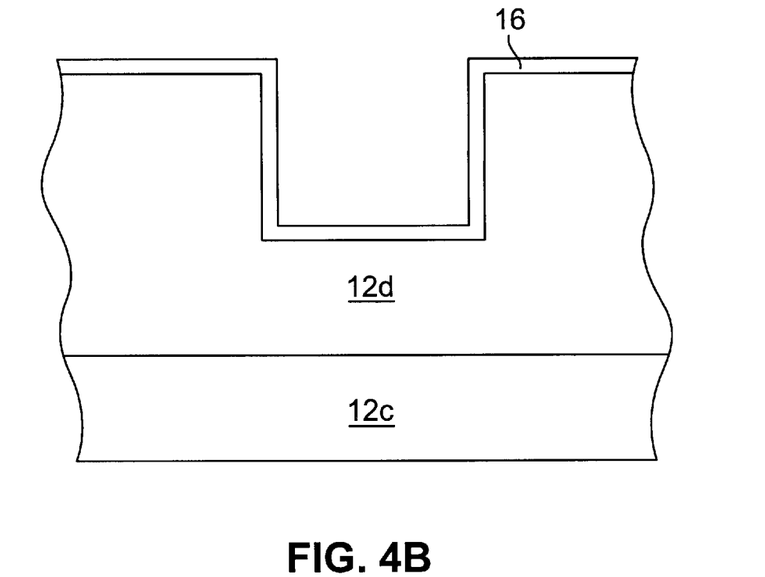
Figure 5:
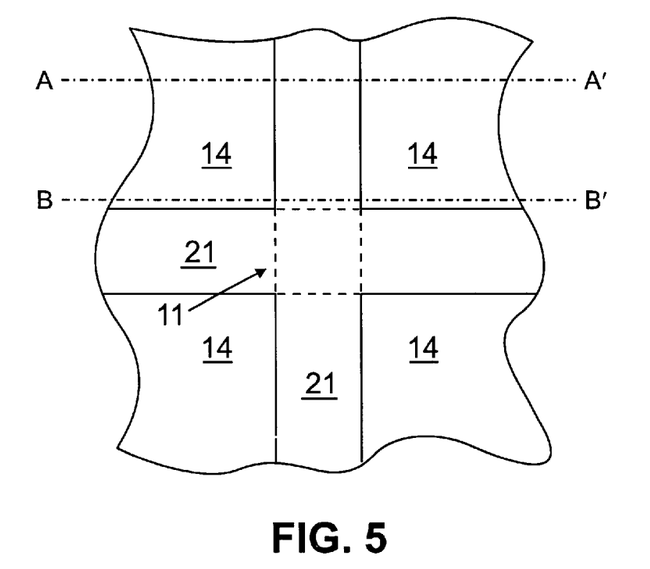
FIG. 5 is a partial plan view of a trench Schottky barrier rectifier illustrating the relative locations of the cross-sections of FIGS. 3A–3G and 4A–4G.

An insulating layer, preferably an oxide layer 16, is then formed over the surface of the structure (e.g., by thermal oxidation) as shown in FIGS. 3B and 4B. Thicknesses in the vicinity of about 700 to 2000 Angstroms are typical for thermal oxide layer 16. The structures of FIG. 3B and FIG. 4B remain essentially the same at this point in the process.

Figure 3C:
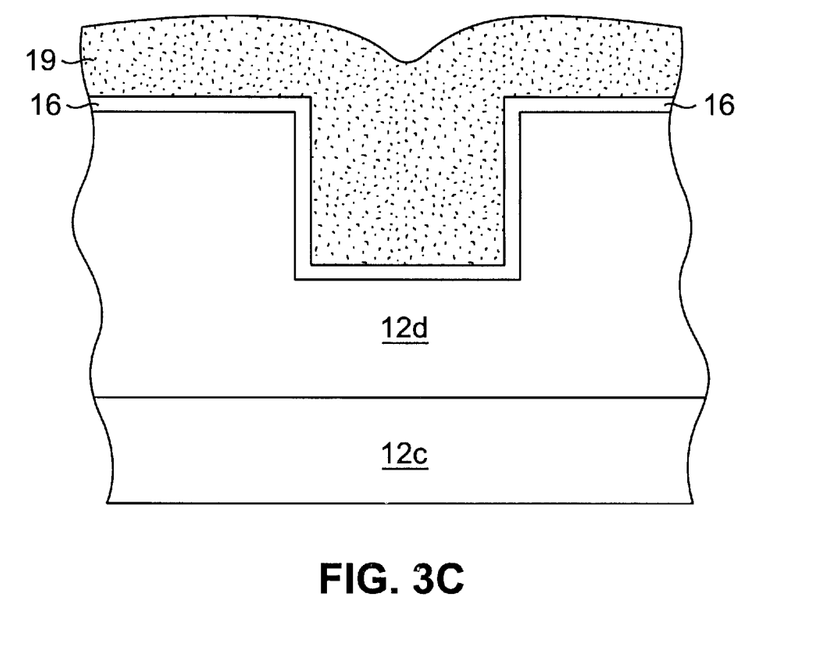
Figure 4C:
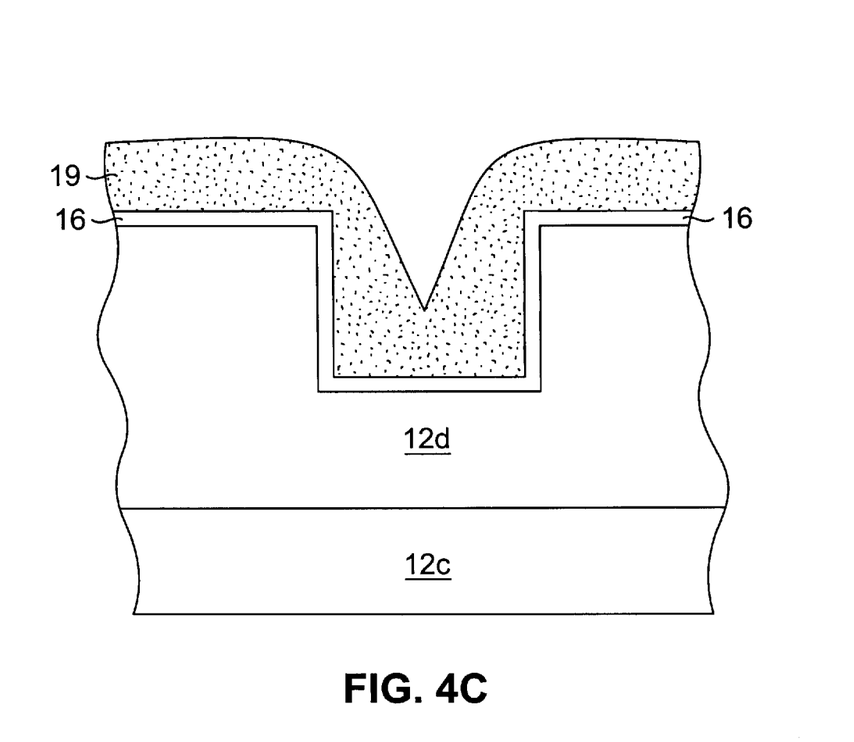

The device is subsequently covered (and the trenches are filled) with a polysilicon (i.e., polycrystalline silicon) layer 19, using techniques known in the art such as CVD, to provide the structure shown in FIG. 3C and FIG. 4C. As seen from these figures, the polysilicon 19 is shallower near the trench intersection regions (FIG. 4C) than it is further away from trench intersection (FIG. 3C). Polysilicon layer 19 is typically doped N-type to reduce its resistivity. N-type doping can be carried out, for example, during CVD with phosphorous chloride or by implantation with arsenic or phosphorous.

Figure 3D:
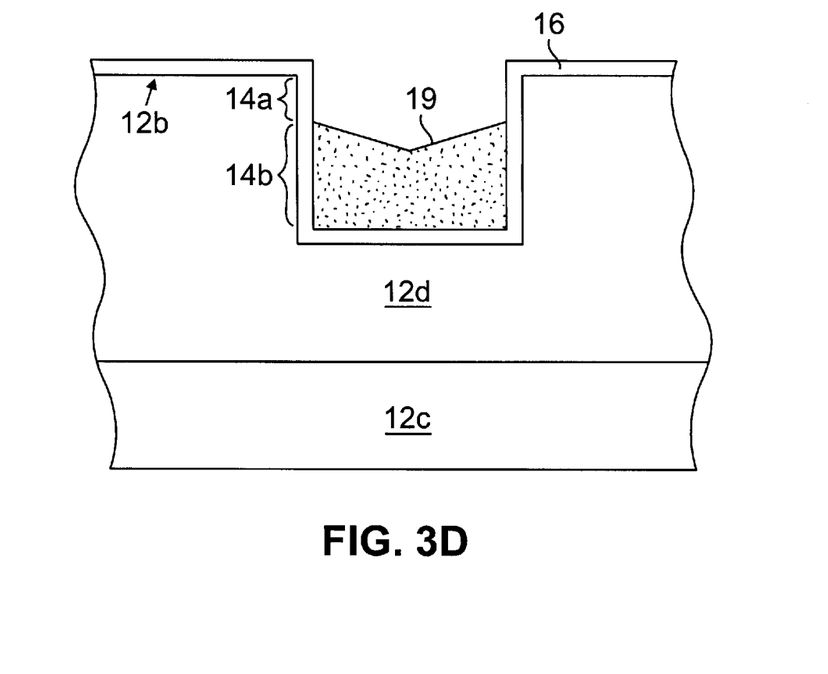
Figure 4D:
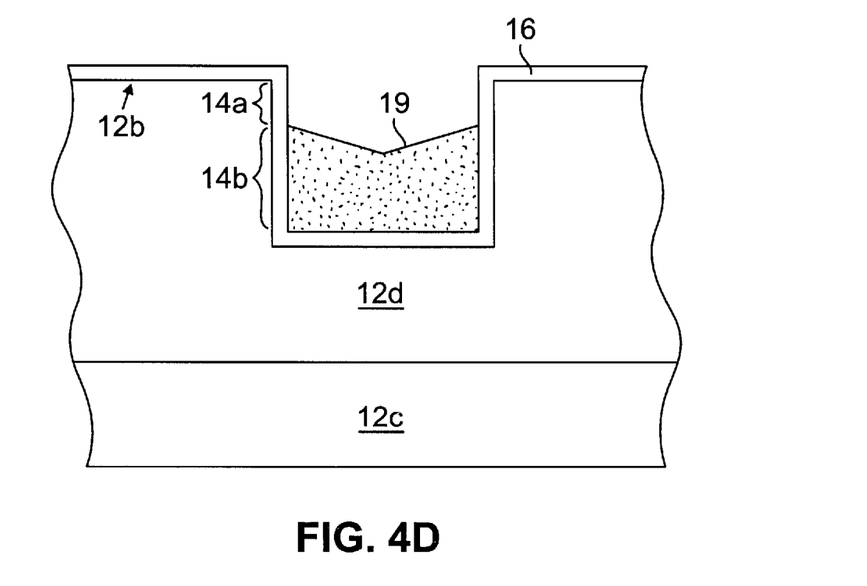
Figure 8:
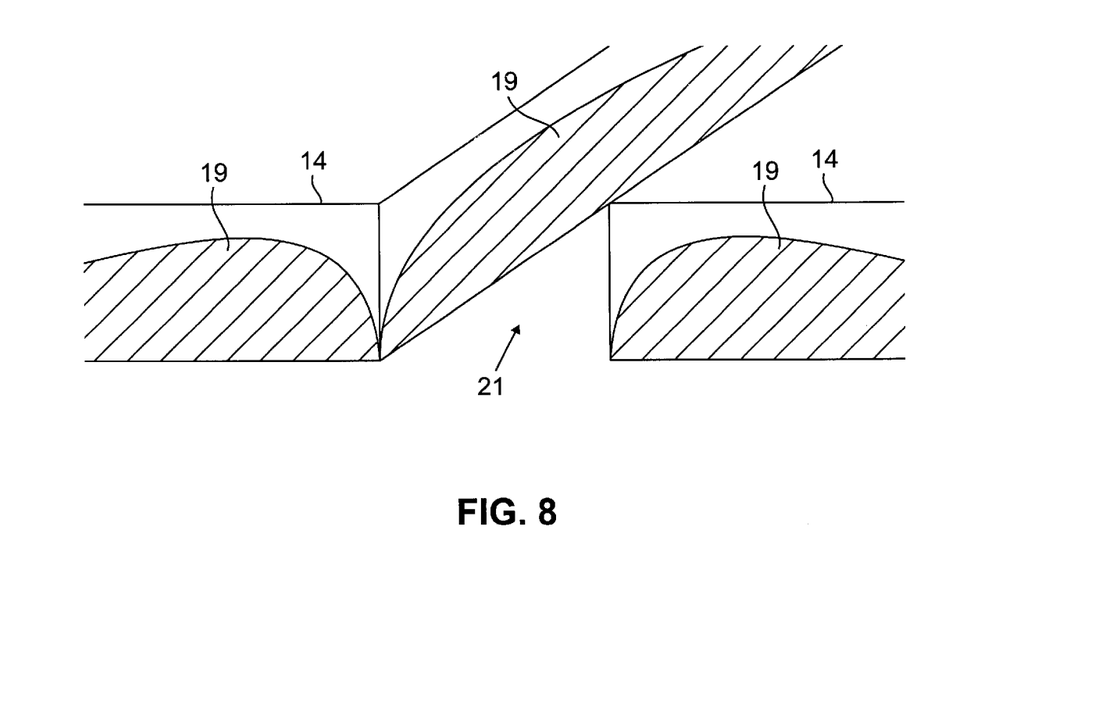
FIG. 8 is a partial view of a trench intersection region, which provides a two-dimensional rendering of the regions where polysilicon contacts the trench walls after polysilicon etch.

Polysilicon layer 19 is then isotropically etched (for example, by reactive ion etching) to expose the portions of the oxide layer 16 along surfaces 12b and along upper portions 14a as shown in FIG. 3D and FIG. 4D. Portions of the oxide layer 16 along lower portions 14b remains covered with polysilicon 19. Because the polysilicon is shallower near the trench intersection regions before etch (compare FIG. 4C with FIG. 3C above), the polysilicon is also shallower in these regions after etch (compare FIG. 4D with FIG. 3D). FIG. 8 is a partial view of a trench intersection region illustrating trench 21 and mesas 14. Also shown in FIG. 8 is a two-dimensional illustration of where the polysilicon 19 contacts the trench walls after the etch step.

Figure 3E:
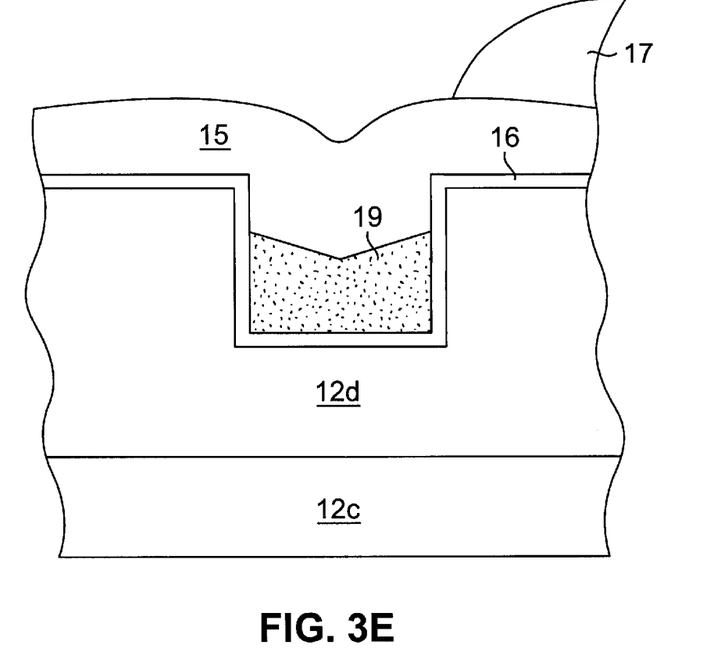
Figure 3F:
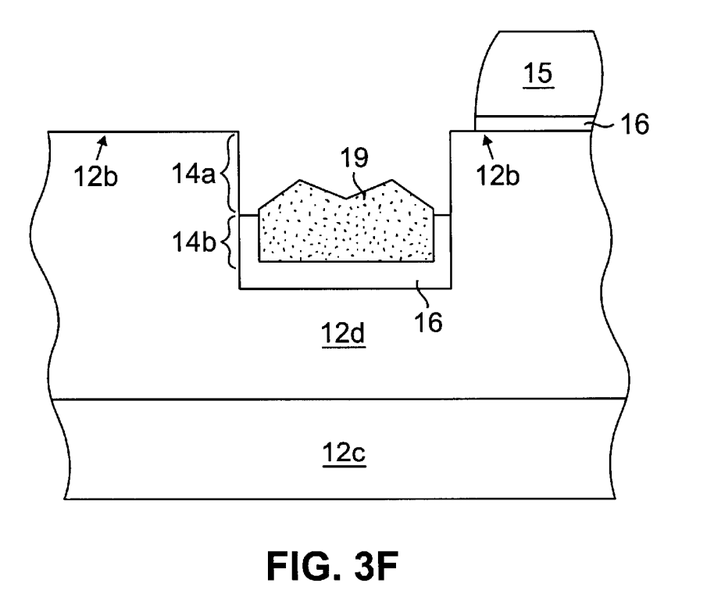
Figure 3G:
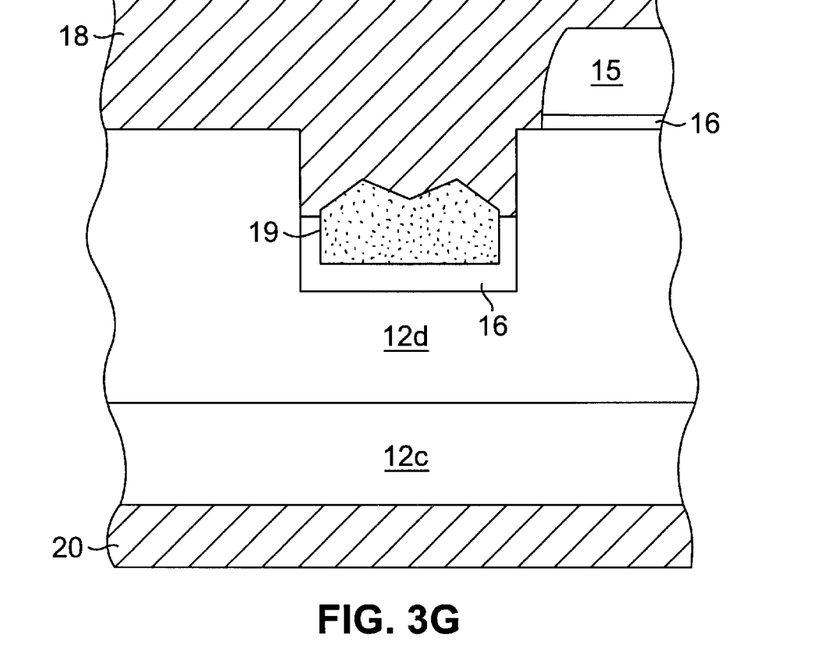
Figure 4E:
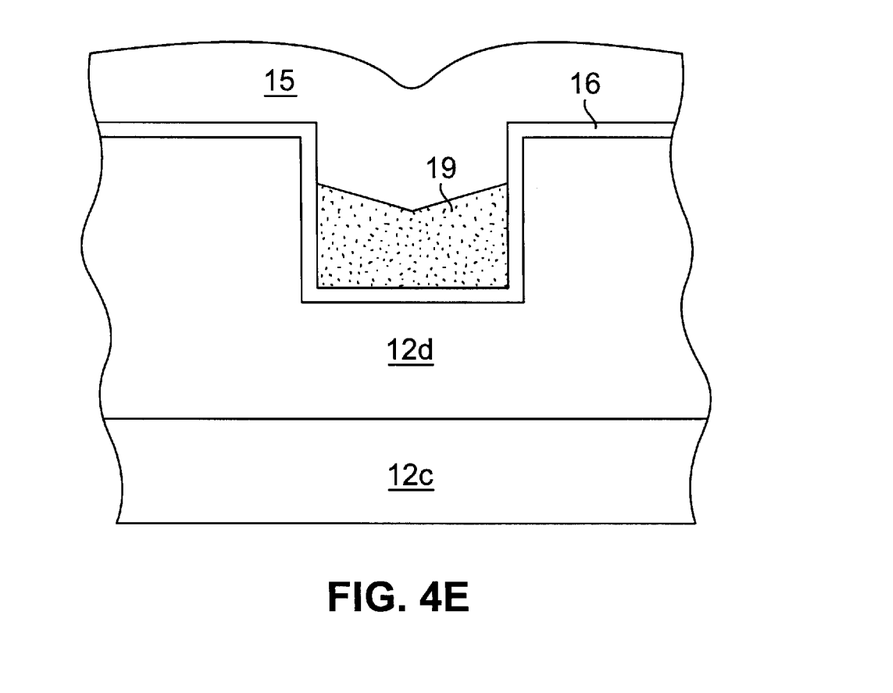

A BPSG (borophosphosilicate glass) layer 15 is then formed over the entire structure, for example, by PECVD, and provided with a patterned photoresist layer 17 in the termination regions. (For convenience, the disposition of the BPSG layer in the termination regions is shown in these figure sequences.) The resulting structure is illustrated in FIG. 3E and FIG. 4E.

The structure is etched, typically by reactive ion etching, resulting in the removal of BPSG where it is not protected by photoresist. The BPSG regions 15 remaining behind after etch partially overlie the outer drift regions 12d (see FIG. 3F). These regions act as field plates, which terminate the electrical field generated by the rectifier while in operation. The photoresist is then removed, resulting in the structure of FIG. 3F and FIG. 4F.

In addition to BPSG, a certain amount of the polysilicon is also removed from the structure in the course of this etching step, eroding polysilicon structures 19. As a result, the already shallow polysilicon regions 19 at the trench intersection regions (see FIG. 4E) become even shallower after these steps (see FIG. 4F).

Figure 4F:
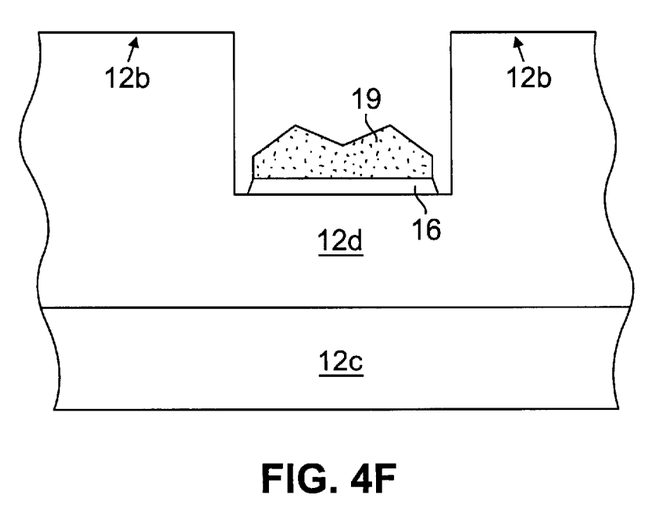
Figure 4G:
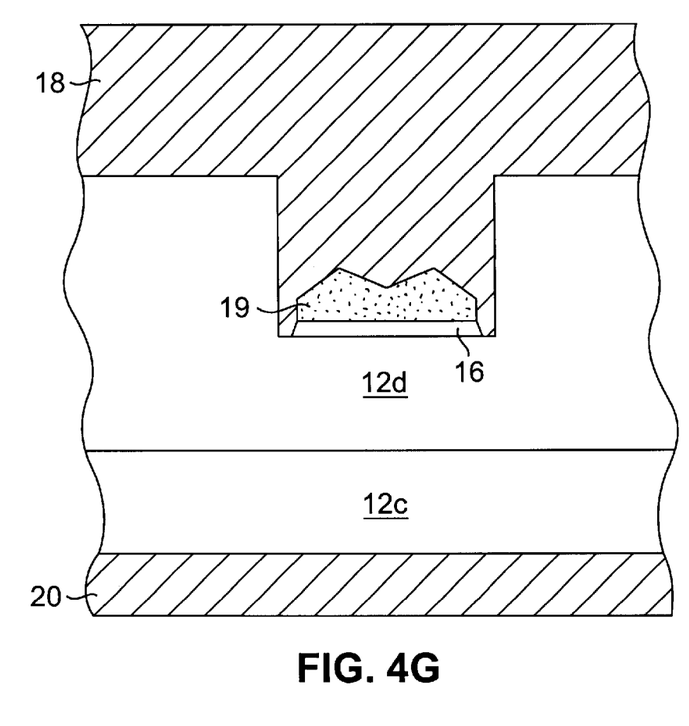

Oxide, where not covered by BPSG or polysilicon 19, is also removed during this etching step. As a result, oxide 16 is removed from portions of upper faces 12b of the drift region 12d, as well as the upper portions 14a of the trench walls associated with these regions. Near the trench intersection regions, due to the shallow depth of polysilicon 19 in those regions, the oxide 16 can be etched substantially to the trench bottom as shown in FIG. 4F.

The structure is then provided with metal contact layer 18 to create an anode electrode for the device, and metal contact layer 20 to create a cathode electrode for the device.

Because the oxide can be etched so severely near the trench intersection regions, the anode contacts the drain region along substantially the entire trench sidewall (and, in many cases, a portion of the trench bottom). One consequence of this state of affairs is that the desired "pinch off" effect discussed above is substantially degraded. As a result, reverse bias breakdown voltages are lowered and leakage currents are increased for the device, harming performance and yield.

In accordance with an embodiment of the present invention, a protective process and structure are provided by which this undesirable result is avoided. The protective process modifies the above process near the trench intersection regions by forming protective regions over the trench intersection regions. Such protective regions are preferably oxide-etch-resistant regions such as BPSG regions, but other materials can be used.

As will become more apparent from the discussion below, with the protective process, the cross-sections corresponding to the position of line A–A' of FIG. 5 (FIGS. 3A–3G) are largely unchanged.

The cross-sections corresponding to the position of line B–B' do change, however, due to the formation of the protective regions. More specifically, the protective process is the same as the above process up to the point where the polysilicon layer is etched (see FIG. 4D).

In the above process, a BPSG layer 15 is formed at this point, and the structure is provided with photoresist features in the termination regions (see FIG. 4E, recalling that these photoresist features do not appear in this figure, but rather appear in FIG. 3E).

Figure 7A:
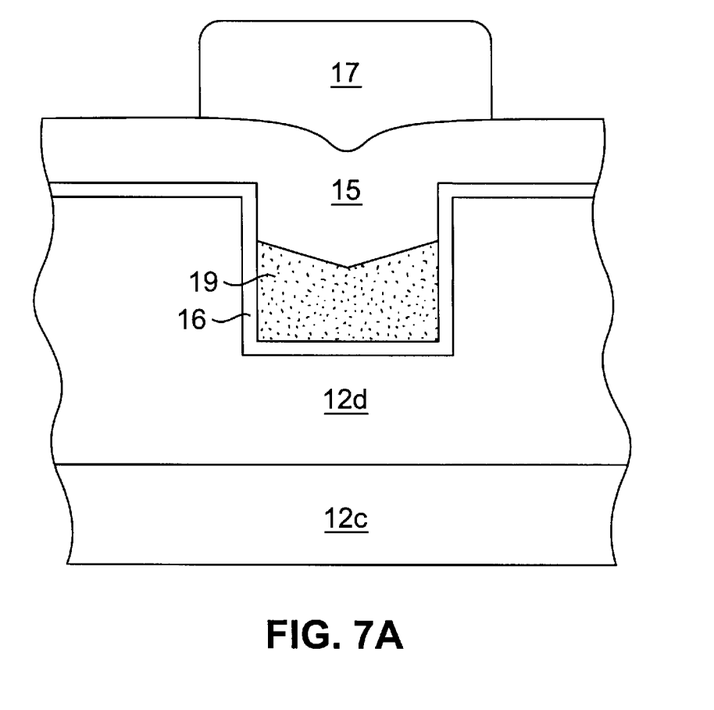
FIGS. 7A–7C are partial cross-sectional views taken along line B–B' of FIG. 6B, which illustrate a method by which a trench Schottky barrier rectifier can be fabricated, in accordance with an embodiment of the present invention.

In contrast, in the protective process of the present invention, after formation of the BPSG layer 15, a patterned photoresist layer 17 is provided that not only protects the BPSG layer in the termination regions, but also protects the BPSG layer where the trenches intersect. As a result, instead of forming a structure in which the trench intersections regions appear as in FIG. 4E, a structure is provided in which the BPSG layer 15 is protected by a photoresist feature 17 as shown in FIG. 7A.

Figure 6A:
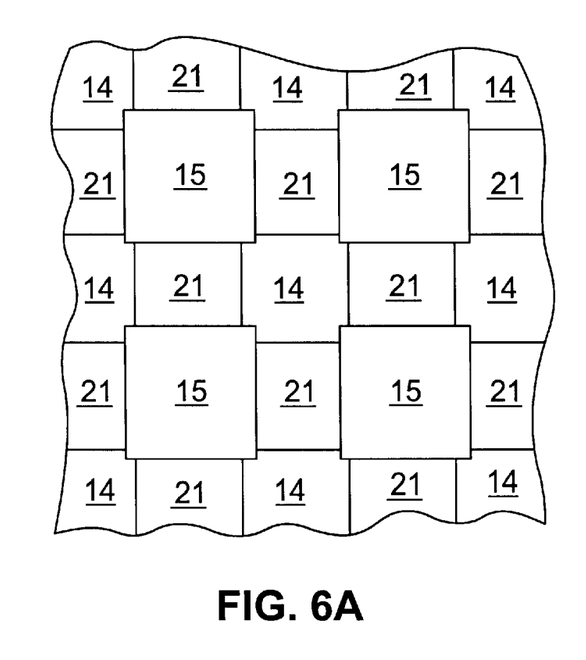
FIGS. 6A and 6B are partial plan views of a trench Schottky barrier rectifier, illustrating the locations of the protective features of one embodiment of the present invention relative to the trenches and mesas of the rectifier.
Figure 6B:
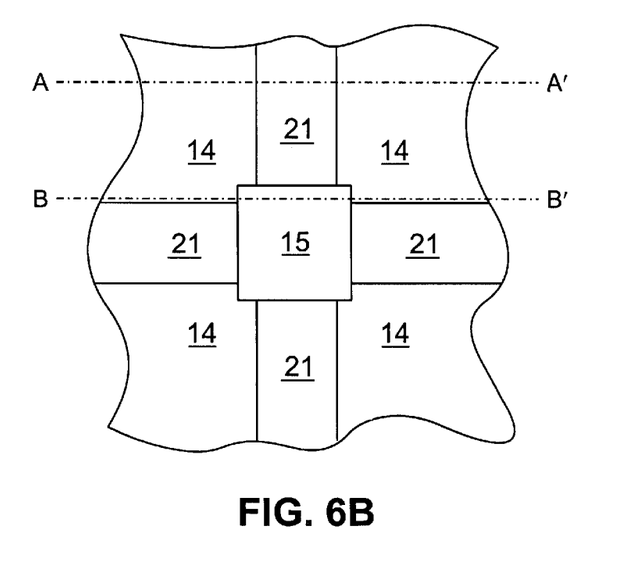

A partial plan view illustrating these photoresist features is shown in FIGS. 6A and 6B, with FIG. 6A giving a larger scale perspective of the BPSG features than FIG. 6B. (FIGS. 6A and 6B illustrate a portion of the device near the center and hence do not illustrate the BPSG features found in the termination regions.) The arrangement of the photoresist features 17 relative to trenches 21 defining semiconductor mesa regions 14 is shown. Note that while rectangular mesas are shown, the present invention applies to any design in which mesas are formed by intersecting trenches. Note also that, as shown, these regions extend slightly beyond the trench intersection regions. As used herein, "trench intersection regions" (also referred to herein as "trench intersections") those trench regions that are common to two or more trenches. As a specific example, the trench intersection region of FIG. 5 is that region enclosed within a rectangle 11 defined by a dashed line.

Figure 7B:
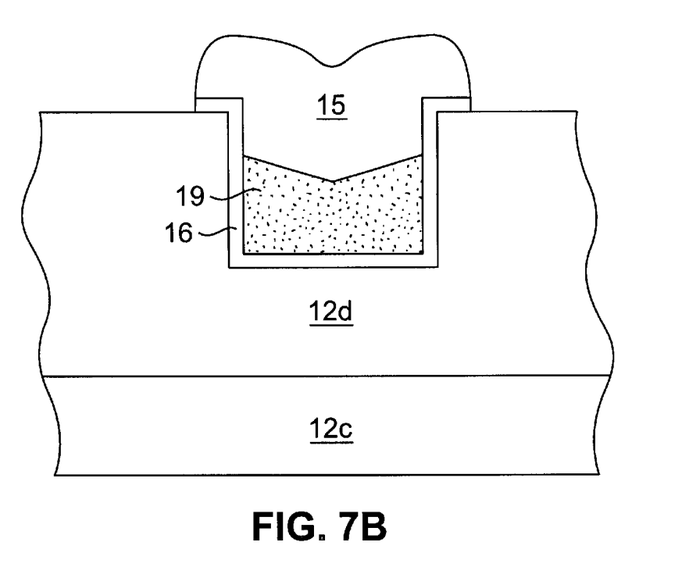

Continuing with this process, as with FIG. 4F above, a BPSG etch step is conducted, followed by removal of photoresist. This results in a structure like that of FIG. 7B. As can be seen from this figure, the presence of the BPSG features 15 near the trench intersection regions prevents the oxide 16 from being etched substantially to the trench bottom, avoiding the above-noted, undesirable degradation in "pinch-off". Although rectangular BPSG protective features are formed in this particular embodiment, it will become immediately apparent to one skilled in the art that other geometries are possible, so long as an over-etching of the oxide is prevented within the trenches in the vicinity of the trench intersection locations.

Figure 7C:
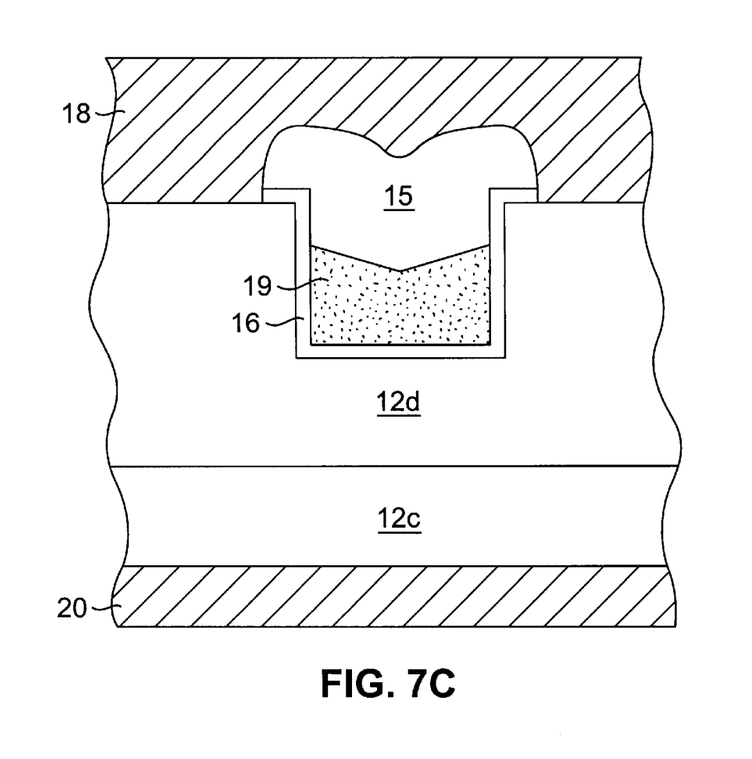

The structure is then provided with metal contact layers 18 and 20 (as in FIG. 4G above), which act as anode and cathode electrodes for the device. The resulting structure is shown in FIG. 7C.

Again, the primary modifications set forth in the protective process are found in the trench intersection regions. Hence, the cross sections of FIGS. 7A–7C differ substantially from the cross sections of FIGS. 4E–4G. In the non-trench intersection regions, however, the cross sections (not shown) are essentially the same as the cross sections of FIGS. 3E–3G.

Although the present invention has been described with respect to several exemplary embodiments, there are many other variations of the above-described embodiments that will be apparent to those skilled in the art. It is understood that these variations are within the teaching of the present invention, which is to be limited only by the claims appended hereto.

What is claimed is:

1. A trench Schottky barrier rectifier, comprising:
    a semiconductor region having first and second opposing faces, said semiconductor region comprising a drift region of first conductivity type adjacent the first face and a cathode region of said first conductivity type adjacent the second face, said drift region having a lower net doping concentration than a net doping concentration of said cathode region;
    a plurality of trenches extending into said semiconductor region from said first face, said trenches defining a plurality of mesas within said semiconductor region and said trenches forming a plurality of trench intersections;
    an oxide layer, said oxide layer covering said semiconductor region on bottoms of said trenches and on lower portions of sidewalls of said trenches;
    a polysilicon region disposed over said oxide layer within said trenches;
    insulating regions at said trench intersections, said insulating regions covering a portion of said polysilicon region and a portion of said oxide layer at said trench intersections; and
    an anode electrode that is adjacent to and forms a Schottky rectifying contact with said drift region.

2. The trench Schottky barrier rectifier of claim 1, wherein said first conductivity type is n-type conductivity.

3. The trench Schottky barrier rectifier of claim 1, wherein said trenches are etched into said drift regions, but not into said cathode region.

4. The trench Schottky barrier rectifier of claim 1, wherein said trenches extend through said drift region and into said cathode region.

5. The trench Schottky barrier rectifier of claim 1, wherein said semiconductor is a silicon semiconductor.

6. The trench Schottky barrier rectifier of claim 1, wherein said oxide is silicon dioxide.

7. The trench Schottky barrier rectifier of claim 1, wherein said insulating regions are borophosphosilicate glass regions.

8. The trench Schottky barrier rectifier of claim 1, wherein said trenches intersect at right angles to one another.

9. The trench Schottky barrier rectifier of claim 8, wherein said insulating regions at said trench intersections are rectangular when viewed from above said trenches.

* * * * *